United States Patent [19]

Leibovitz et al.

[11] Patent Number: 5,200,300
[45] Date of Patent: * Apr. 6, 1993

[54] METHODS FOR FORMING HIGH DENSITY MULTI-CHIP CARRIERS

[75] Inventors: Jacques Leibovitz, San Jose; Maria L. Cobarruviaz, Cupertino; Kenneth D. Scholz, Palo Alto; Clinton C. Chao, Redwood City, all of Calif.

[73] Assignee: Hewlett-Packard Company, Palo Alto, Calif.

[ * ] Notice: The portion of the term of this patent subsequent to Oct. 8, 2008 has been disclaimed.

[21] Appl. No.: 662,860

[22] Filed: Mar. 1, 1991

Related U.S. Application Data

[63] Continuation-in-part of Ser. No. 360,828, Jun. 1, 1989, Pat. No. 5,055,425, and a continuation-in-part of Ser. No. 439,713, Nov. 20, 1989, abandoned.

[51] Int. Cl.⁵ .................. H01L 21/283; H01L 21/312
[52] U.S. Cl. .................................. 430/312; 430/311; 437/195; 437/189; 428/137; 428/209
[58] Field of Search ................ 430/311, 312; 437/195, 437/189, 203, 228, 208; 428/137, 209, 210, 426, 457

[56] References Cited

U.S. PATENT DOCUMENTS 5,035,939 7/1991 Conlon et al. .................. 430/312
5,055,425 10/1991 Leibovitz .......................... 437/195

Primary Examiner—Marion E. McCamish
Assistant Examiner—S. Rosasco

[57] ABSTRACT

A method for fabricating high density multi-chip carriers for integrated circuits includes the steps of forming a circuit pattern on a substrate, depositing a composite metal layer and a photoresist layer over the circuit pattern, forming apertures in the photoresist layer, forming solid metal vias in the apertures and, then, removing the photoresist layer. After removal of the first photoresist layer, a second photoresist layer is deposited over the solid vias and the circuit pattern. With the second photoresist layer in place, unprotected portions of the composite layer are etched away. Then, the second photoresist layer is stripped away. Next, a layer of photosensitive dielectric material is formed over the structure and, finally, sufficient portions of the photosensitive dielectric material are removed to expose the top surfaces of the solid vias.

15 Claims, 1 Drawing Sheet

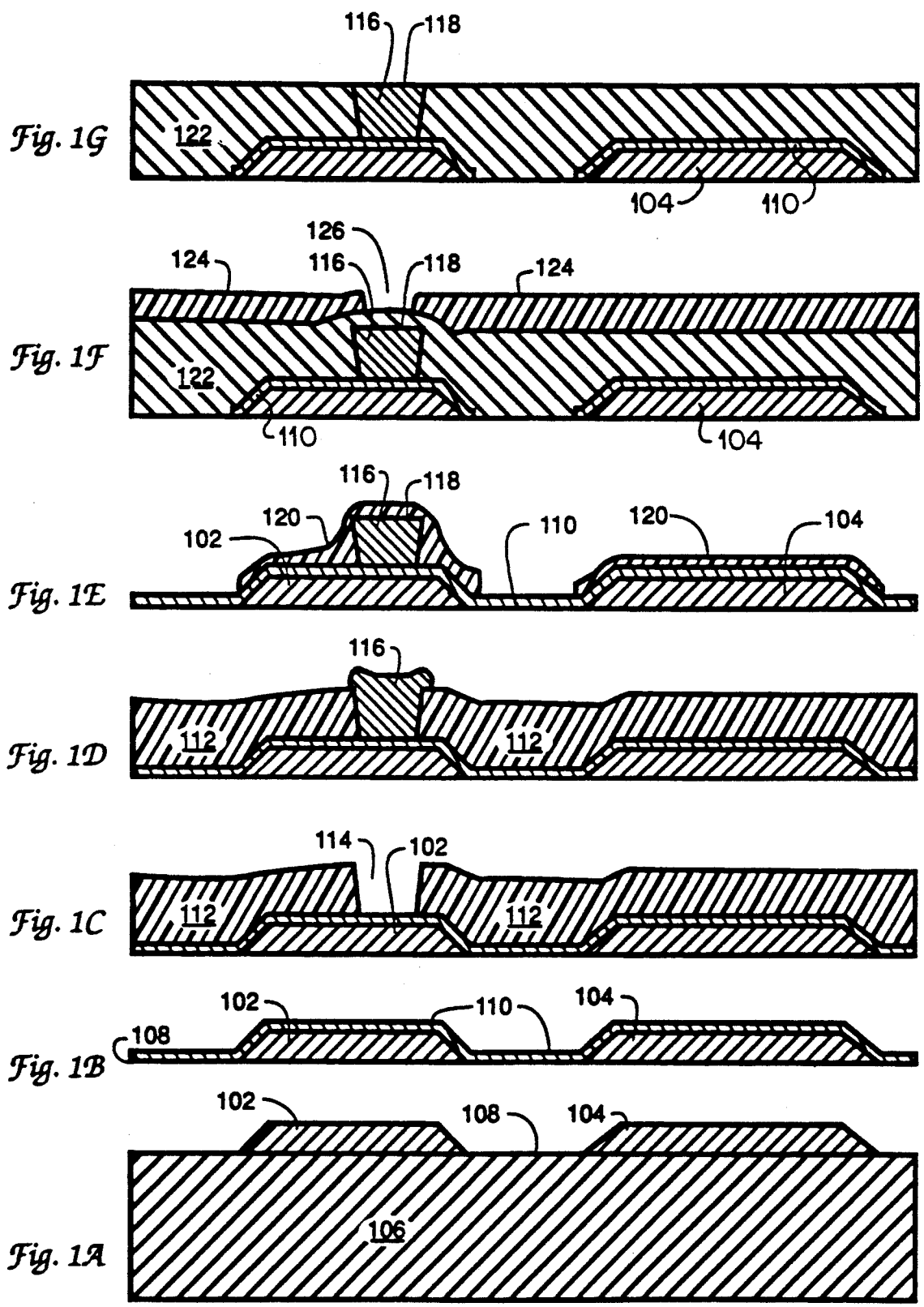

METHODS FOR FORMING HIGH DENSITY MULTI-CHIP CARRIERS

RELATED APPLICATIONS

The present application is a Continuation-In-Part of commonly-assigned U.S. Pat. application Ser. No. 07/360,828, filed Jun. 1, 1989, entitled "STACKED SOLID VIA FORMATION IN INTEGRATED CIRCUIT SYSTEMS," now U.S. Pat. No. 5,055,425 and commonly-assigned U.S. patent application Ser. No. 07/439,713, filed Nov. 20, 1989, entitled "METHOD AND APPARATUS FOR REEL TO REEL MANUFACTURING OF HIGH PERFORMANCE MULTILAYER CIRCUIT INTERCONNECT UNITS" now abandoned the entire disclosures of which are hereby incorporated by reference herein, and priority to which is claimed.

BACKGROUND OF THE INVENTION

1. Field of the invention

The present invention generally relates to methods for fabricating integrated circuits and, more particularly, to methods for forming high density multi-chip carriers for integrated circuits.

2. State of the Art

It is known to provide multi-chip carrier structures that permit two or more integrated circuit chips to be mounted on a common carrier without the need for packaging the chips individually. Although such multi-chip carriers can be fabricated using a variety of technologies, the highest densities have been achieved using photolithographic techniques that define multiple layers of circuits which are interconnectable by metallic vias extending through intermediate dielectric layers. In practice, the metallic vias are formed in apertures that are coated by sputtering or chemical vapor deposition techniques.

SUMMARY OF THE INVENTION

Generally speaking, the present invention provides methods for fabricating high density multi-chip carriers for integrated circuits. In the preferred embodiment, the methods include the steps of forming a circuit pattern on a substrate, depositing a composite metal layer and a photoresist layer over the circuit pattern, forming apertures in the photoresist layer, forming solid metal vias in the apertures and, then, removing the photoresist layer. After removal of the first photoresist layer, a second photoresist layer is deposited over the solid vias and the circuit pattern. With the second photoresist layer in place, exposed areas of the composite layer are etched away. Then, the second photoresist layer is stripped away. Next, a layer of photosensitive dielectric material is formed over the structure and, finally, sufficient portions of the photosensitive dielectric material are removed to expose the top surfaces of the solid vias. In the preferred embodiment, the photosensitive dielectric material is photosensitive polyimide.

In practice, removal of selected portions of the photosensitive dielectric material is accomplished by known lithographic procedures that can be used with photoresists for removing the unwanted areas with developer. Typically, the developing step is used to clear the top surfaces of the vias.

The photosensitive dielectric material can be used as a substrate for a second series of procedures resulting in the construction of a second layer interconnect pattern over the photosensitive dielectric layer. In practice, the second circuit layer includes circuit layer lines and solid vias that are stacked on some of the solid vias in the first dielectric layer. Then, a second dielectric layer can be fabricated in the manner of the first dielectric layer. Subsequent circuit and dielectric layers can be similarly fabricated, resulting in a multilayer structure with vertical interconnects through several layers.

Since multilayer interconnects can be formed with stacked solid vias, greater circuit density can be achieved in a multi-chip carrier. Moreover, since stacked solid vias minimizes interconnect lengths, impedance and signal travel time are minimized. Furthermore, the stacked solid vias provide effective heat transfer from the mounted integrated circuit chips. These and other features and advantages of the present invention are apparent from the description below with reference to the following drawings.

BRIEF DESCRIPTION OF THE DRAWINGS

The present invention can be further understood with reference to the following description in conjunction with the appended drawings, wherein like elements are provided with the same reference numerals. In the drawings:

FIGS. 1A–1G show structures that result from progressive stages in a semiconductor fabrication process in accordance with the present invention.

DESCRIPTION OF THE PREFERRED EMBODIMENTS

In the structure shown in FIG. 1A, conductor lines 102 and 104 are formed on a substrate 106. The substrate is ordinarily made of silicon with its upper surface 108 being oxidized to silica. However, substrates other than silicon can be used; for example, the substrate can be formed of a metal, or a metal with a dielectric layer, or a flexible polyimide film. The conductor lines 102 and 104 are made of copper usually but, alternatively, can be made of silver, gold, or platinum. In practice, the conductor lines are bonded to surface 108 by a chromium layer about 0.05 micrometers thick.

In the structure shown in FIG. 1B, a thin composite layer 110 has been deposited over conductors 102, 104 and over surface 108. The purpose of composite layer 110 is to conduct electricity for a subsequent electroplating step. The composite layer can comprise, for example, a pair of chromium adhesion layers which surround a copper layer.

In the structure shown in FIG. 1C, a photoresist layer 112 has been deposited over composite layer 110. The thickness of the photoresist layer should equal the height of the vias to be subsequently built on the conductor lines.

As also shown in FIG. 1C, at least one aperture 114 is formed through photoresist layer 112 to define the location of a via. The aperture 114, in the illustrated embodiment, is formed above line 102. In practice, the via apertures are defined photolithographically through the photoresist layer 112. During the photolithographic process, the chromium of the composite layer 110 is exposed at the bottom of aperture 114 and is etched away to expose the underlying copper.

In the structure shown in FIG. 1D, aperture 114 has been filled with a conductive material to form a solid via 116. In practice, the vias are formed by electroplating with copper. As mentioned in co-pending application Ser. No. 07/360,828, and co-pending application Ser. No. 07/439,713, the vias can be formed by electroless plating, in which case the conductive layer below the vias is not required.

In the structure shown in FIG. 1E, the top of via 116 has been polished to form a planar surface. Also, the photoresist layer 112 has been removed and a second layer of photoresist 120 has been deposited. It should be noted that the second photoresist layer 120 provides protection over lines 102, 104 and over via 116 but leaves areas of the composite layer unprotected (i.e., exposed).

The structure of FIG. 1F is several processing steps removed from the structure of FIG. 1E. In the initial step, unprotected portions of composite layer 110 are etched away. After the etching step is completed, the photoresist layer 120 is stripped away. Next, a layer of photosensitive polyimide 122, a dielectric material, is formed over the structure. In the illustrated embodiment, the latter step results in polyimide bulges 126 over the vias 116.

In the structure shown in FIG. 1G, the polyimide bulges 126 have been removed. In practice, removal of the bulges and any other unwanted amounts of polyimide is accomplished by, first, exposing desired areas of the polyimide material to light through a reusable mask. The exposure serves to stabilize the exposed areas but not the unexposed areas (e.g., the bulges) of the photo-sensitive polyimide. The unexposed areas then can be removed by a developer. In the illustrated embodiment, the developing step has been used to clear the top surfaces 118 of the vias 116.

The structure shown in FIG. 1G can serve as a substrate for a second series of procedures resulting in the construction of a second layer interconnect pattern over polyimide layer 122. That is, the photosensitive layer is retained to serve as a dielectric layer. In practice, the second layer interconnect pattern includes both lines and vias. After several iterations, the resulting structure will comprise alternating interconnect and dielectric layers, both of which can include vias.

At this juncture, it can be appreciated that, since multilayer interconnects can be formed with stacked solid vias, greater circuit density can be achieved in a multi-chip carrier. Moreover, since stacked vias minimizes interconnect lengths, impedance and signal travel time are minimized. Furthermore, the stacked solid vias provide effective heat transfer from the mounted integrated circuit chips.

The foregoing has described the principles, preferred embodiments and modes of operation of the present invention. However, the invention should not be construed as limited to the particular embodiments discussed. Instead, the above-described embodiments should be regarded as illustrative rather than restrictive. Accordingly, it should be appreciated that variations may be made in the above-described embodiments without departing from the spirit and scope of present invention as defined by the following claims.

What is claimed is:

1. A method of forming an integrated circuit structure, comprising the steps of:
   a) forming a circuit pattern on a substrate;
   b) depositing a composite metal layer and a photoresist layer over the circuit pattern, and forming apertures in the photoresist layer;
   c) forming solid metal vias in the apertures and, then, removing the photoresist layer;
   d) depositing another photoresist layer over the solid vias and the circuit pattern while leaving preselected areas of the composite material unprotected;
   e) with the second photoresist layer in place, etching away unprotected portions of the composite layer and, then, stripping away the second photoresist layer;
   f) forming a layer of photosensitive dielectric material over the resulting structure; and
   g) removing selected portions of the photosensitive dielectric material to expose top surfaces of the solid vias.

2. The method of claim 1 wherein the photosensitive dielectric material is photosensitive polyimide.

3. The method of claim 1 wherein selected portions of the photosensitive dielectric material is removed by applying a developing agent.

4. The method of claim 1 wherein removal of the selected portions of the photosensitive dielectric material is accomplished by exposing desired portions of the photosensitive dielectric material to light through a reusable mask to stabilize the exposed areas.

5. The method of claim 4 wherein removal of the selected portions of the photosensitive dielectric material is accomplished by, after exposing desired portions of the photosensitive dielectric material to light through a reusable mask, removing the unexposed areas by etching.

6. The method of claim 5 wherein the etching step is used to clear the top surfaces of the vias.

7. The method of claim 1 wherein the photosensitive dielectric material is used as a substrate for a second series of procedures resulting in the construction of a second layer interconnect pattern over the photosensitive dielectric layer.

8. The method of claim 1 wherein vias are electroplated on the photosensitive dielectric layer.

9. The method of claim 1 wherein the apertures are defined photolithographically through the photoresist layer.

10. The method of claim 9 wherein chromium in a composite layer is photolithographically exposed at the bottom of the apertures and is etched away to expose copper beneath it.

11. A method of forming an integrated circuit structure, comprising the steps of:
    a) depositing a composite metal layer and a photoresist layer over a circuit pattern;
    b) forming solid metal vias in apertures in the photoresist layer and, then, removing the photoresist layer;
    c) etching away selected portions of the composite layer;
    d) forming a layer of photosensitive dielectric material over the resulting structure; and
    e) removing selected portions of the photosensitive dielectric material to expose top surfaces of the solid vias.

12. The method of claim 11 wherein the photosensitive dielectric material is photosensitive polyimide.

13. The method of claim 11 wherein selected portions of the photosensitive dielectric material is removed by applying a developing agent.

14. The method of claim 11 wherein removal of the selected portions of the photosensitive dielectric material is accomplished by exposing desired portions of the photosensitive dielectric material to light through a reusable mask to stabilize the exposed areas of the photo-sensitive polyimide.

15. The method of claim 11 wherein the photosensitive dielectric material is used as a substrate for a second series of procedures resulting in the construction of a second layer interconnect pattern over the photosensitive dielectric layer.

* * * * *